US006429537B2

(12) United States Patent
Hauser et al.

(10) Patent No.: US 6,429,537 B2
(45) Date of Patent: Aug. 6, 2002

(54) SEMICONDUCTOR COMPONENT WITH METHOD FOR MANUFACTURING

(75) Inventors: Christian Hauser, Regensburg; Martin Neumayer, Elsendorf; Johann Winderl, Wackersdorf; Achim Neu; Martin Reiss, both of Regensburg, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/816,931

(22) Filed: Mar. 23, 2001

(30) Foreign Application Priority Data

Mar. 23, 2000 (DE) .......................... 100 14 304

(51) Int. Cl.[7] .......................... H01L 23/31; H01L 23/28
(52) U.S. Cl. ........................................ 257/790; 257/738
(58) Field of Search ................................. 257/737, 738, 257/790

(56) References Cited

U.S. PATENT DOCUMENTS 5,612,569 A  3/1997  Murakami ................. 257/666
5,677,566 A  * 10/1997  King et al. ................. 257/666
5,973,337 A  * 10/1999  Knapp et al. ............... 257/100

FOREIGN PATENT DOCUMENTS

DE  33 10 654 A1  9/1984  .......... H01L/21/56
EP  0880175 A2  * 11/1998  ......... H01L/23/498

* cited by examiner

Primary Examiner—Allan R. Wilson
(74) Attorney, Agent, or Firm—Laurence A. Greenberg; Werner H. Stemer; Ralph E. Locher

(57) ABSTRACT

A semiconductor component includes a semiconductor chip having contact pads on its main face, and a wiring foil, in which are recesses for the contact pads, applied to the main face. The foil has conductor tracks on a side facing away from the main side. The conductor tracks connect the contact pads to solder contacts. The contact pads located in the recess are electrically connected via wire connections to adjacent conductor track ends. Each wire connection is surrounded with a sealing compound of a first and a second layer. A method for manufacturing a semiconductor component includes applying wiring foil to a main side of the chip, producing the wire connection between contact pads and adjacent conductor track ends, applying sealing compound to locations on the recess to completely cover the wire connection with the sealing compound, and only curing the surface of the sealing compound.

11 Claims, 1 Drawing Sheet

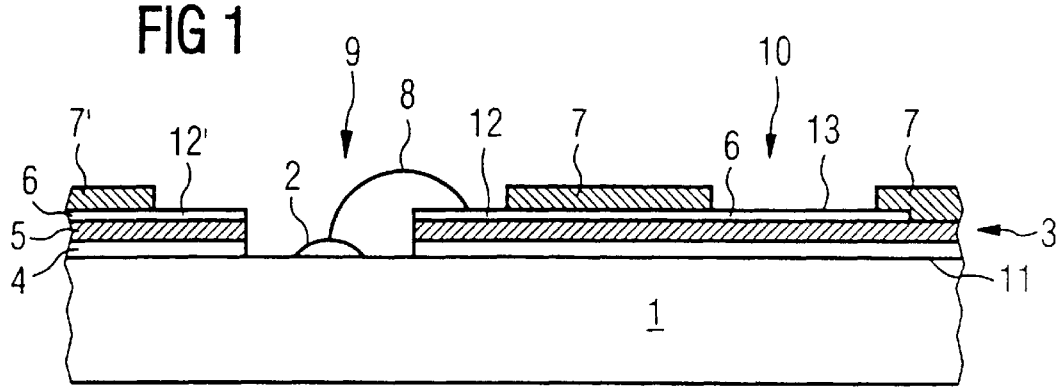
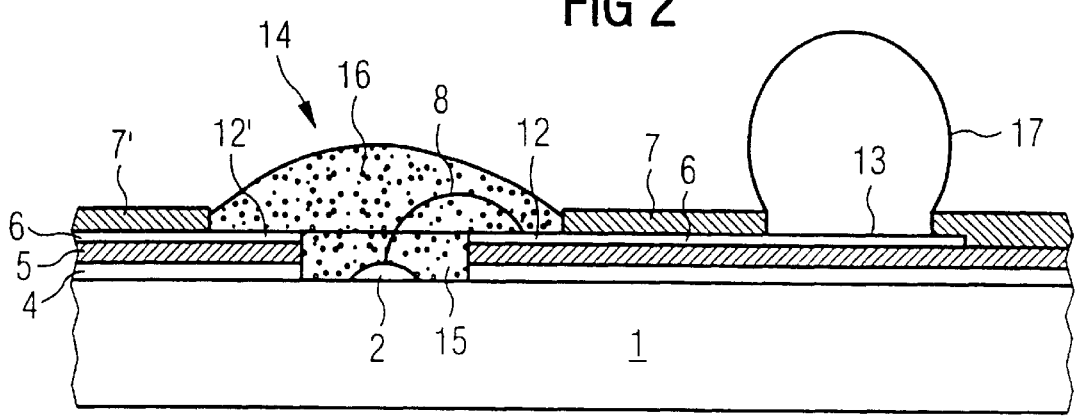
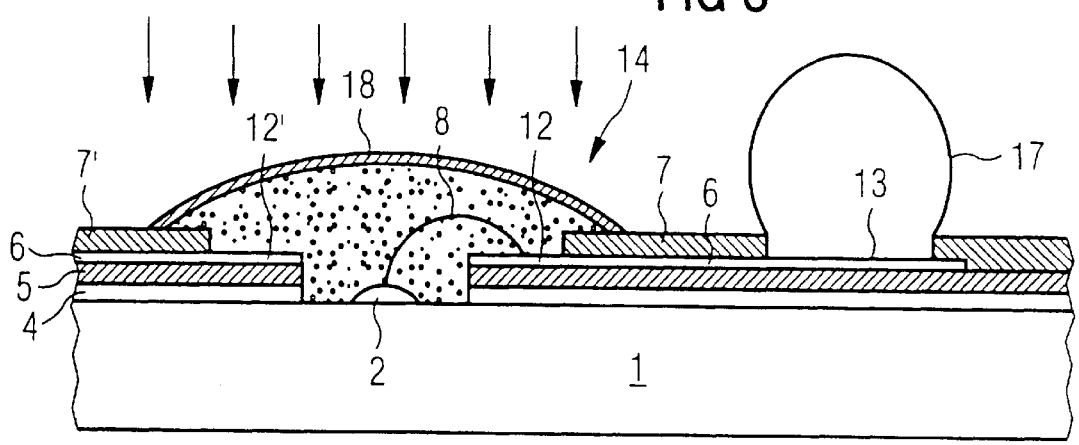

SEMICONDUCTOR COMPONENT WITH METHOD FOR MANUFACTURING

BACKGROUND OF THE INVENTION

Field of the Invention

The invention lies in the field of semiconductors. The invention relates to a semiconductor component with a semiconductor chip having contact pads on a first main face, a wiring foil with recesses for the contact pads applied to the first main face and having, on a side facing away from the first main side of the semiconductor chip, conductor tracks for connecting the contact pads to solder contacts. The contact pads located in the at least one recess are electrically connected through wire connections to adjacent conductor track ends and each wire connection is surrounded by a sealing compound. The invention also relates to a method for manufacturing such a semiconductor component.

Semiconductor components with a board on chip ("BOC") housing are applied to a carrier substrate using a ball grid array ("BGA") and are electrically connected to it. The characterizing feature of these BOC housings is a wiring foil having conductor tracks on a side facing away from the first main side of the semiconductor chip, which conductor tracks end in the vicinity of the recesses of the wiring foil. The at least one recess in the foil permits the end of the conductor track to be electrically connected by a bonding wire to the contact pad or pads located in the recess. A solder stop mask, in which there are recesses for the other ends of the conductor tracks, is usually applied to the conductor tracks. A solder contact is electrically conductively connected to these exposed ends of the conductor tracks. The solder contact can be embodied, for example, as a ball. To avoid damage to the bonding wires, for example, when the semiconductor component is applied to the carrier substrate (board), the recess of the contact pads and the bonding wires are completely coated with a sealing compound. The sealing compound may be, for example, an epoxide mass. It is selectively applied in a liquid state to the points on the recesses and the bonding regions of the conductor tracks and is subsequently cured. The sealing compound is used to protect the active chip structures against moisture and to provide mechanical protection to the bonding wires. The sealing must be carried out such that all the depressions are filled in without air occlusions. At the same time, the bonding wires must be covered, in particular, at the connection point to the conductor track ends. The height of the sealing compound must not exceed the diameter of the solder contacts because otherwise it would no longer be possible to make an electrical connection between the semiconductor component and the carrier substrate. The application of the sealing compound constitutes a serious problem in practice because the viscous material of the sealing compound spreads quickly, especially on the solder stop resist that is applied to the conductor tracks. The sealing compound could, thus, flow into the recess or recesses provided for the solder contacts. However, if the sealing compound gets-into these recesses, it is no longer possible to produce a reliable soldered connection between the conductor track end and the solder contact.

To avoid such a problem, the distance between the recesses for the soldered contacts and the at least one recess in which the contact pads are located can be made such a size that the sealing compound has enough "flowing path" until it hardens. However, the configuration places strict limits on the miniaturization of the semiconductor component.

SUMMARY OF THE INVENTION

It is accordingly an object of the invention to provide a semiconductor component and method for manufacturing it that overcomes the hereinafore-mentioned disadvantages of the heretofore-known devices and methods of this general type and that overcomes the above-mentioned disadvantages in a simple way.

With the foregoing and other objects in view, there is provided, in accordance with the invention, a semiconductor component, including a semiconductor chip having a main face, at least one contact pad disposed on the main face, at least one wire connection, at least one solder contact, a wiring foil applied to the main face, the wiring foil having at least one recess for accommodating the at least one contact pad in the at least one recess, the wiring foil having, on a side facing away from the main side of the semiconductor chip, at least one conductor track for connecting the at least one contact pad to the at least one solder contact, the at least one conductor track having conductor track ends, the at least one contact pad electrically connected to at least one of the conductor track ends through the at least one wire connection, and a sealing compound surrounding the at least one wire connection, the sealing compound having a first layer and a second layer.

The invention proposes to have the sealing compound be made of a first layer and a second layer. Advantageously, the first layer merely fills the at least one recess in which the contact pads are located. On the other hand, the second layer covers the wire connection projecting out of the first layer, and the adjacent conductor track end. The adjacent conductor track end is understood here to be the region in which the connection is produced between the conductor track end and the wire connection. After the provision of the first and second layers, the entire wire connection including the bonding contacts is surrounded with a sealing compound. If the first layer has a low viscosity, the sealing compound can spread out in the recess without air occlusions occurring. On the other hand, the second layer advantageously has a high viscosity. Because the second layer is positioned above the edges of the recess, it would be able to spread along the conductor tracks and along a solder stop mask in the direction of the recesses for the soldered contacts. However, due to the high viscosity, the spreading takes place only very slowly so that the sealing compound can be cured before the critical regions are reached.

The invention makes it advantageously possible to keep small the distances between the at least one recess in which the contact pads are located and the recesses in which the later soldered contacts are used. The configuration permits the semiconductor component to be miniaturized.

In accordance with another feature of the invention, the at least one contact pad is electrically connected to adjacent ones of the conductor track ends through the at least one wire connection.

In accordance with a further feature of the invention, the first layer fills a maximum of the at least one recess.

In accordance with an added feature of the invention, the second layer covers the at least one wire connection projecting out of the first layer and the at least one of the conductor track ends.

In accordance with an additional feature of the invention, the first layer has a low viscosity.

In accordance with yet another feature of the invention, the second layer has a high viscosity.

The first and second layers may be made of different materials with different chemical properties. However, it is particularly advantageous if the first and second layers are made of the same material, in which case, the properties of viscosity, thixotropy, and creepage can be adjusted merely by physical properties (for example, filler content). The first layer is advantageously adjusted to a low viscosity. The adjustment makes possible a process for filling the recess without air occlusions. The second layer, which advantageously has a higher viscosity than the first layer, permits a type of "globtop" to be applied without creeping onto the solder stop mask or wetting the recesses for the soldered contacts. The properties of the first and second layers can be adjusted, in particular, by different filler proportions.

In accordance with yet an added feature of the invention, there is provided a solder stop mask disposed on the at least one conductor track, the solder stop mask defining at least one recess for the at least one of the conductor track ends.

Solder balls are advantageously used as the soldered contacts, and are disposed on the wiring foil, that is to say, on the solder stop mask of the wiring foil, in the form of an array.

With the objects of the invention in view, there is also provided a method for manufacturing a semiconductor component, including the steps of:
a) applying the wiring foil to the first main side of the semiconductor chip;
b) producing the wire connection between the contact pads and the adjacent conductor track ends;
c) applying the sealing compound to locations on the at least one recess such that the wire connection is completely covered with the sealing compound; and
d) only curing the surface of the sealing compound.

As becomes clear from the following description of the manufacturing method of an alternative semiconductor component according to the invention, it is not necessary to install any additional processes in comparison with a manufacturing method according to the prior art. The processing times are also marginally longer than a manufacturing method according to the prior art.

In accordance with again another mode of the invention, there is only a short time between the first step and the second step.

In accordance with again a further mode of the invention, a surface of the sealing compound is cured in a period after application of the sealing compound and before the sealing compound, still having a low viscosity, reaches regions of solder contacts.

The manufacturing method according to the invention makes possible a semiconductor component that can be manufactured with existing processes. The sealing compound is applied to the locations on the recesses, for example, by dispensing or printing. The surface advantageously cures within a predetermined period after the application of the sealing compound, the period being dimensioned such that the sealing compound that still has low viscosity after the application has not yet reached the regions of the soldered contacts. The curing of the surface reduces the viscosity of the sealing compound to such an extent that either a type of "skin" forms or the sealing compound on the surface becomes so viscous that it is no longer capable of flowing. As a result, the compound is prevented from running in the direction of the recesses for the soldered contacts. It is, thus, also possible to miniaturize the semiconductor component. However, because the curing according to the invention occurs only at the surface, the sealing compound retains its original flow properties in the interior. As such, the compound can flow on and reliably fill in the cavities so that no air occlusions occur.

The curing of the surface can be performed, for example, by briefly heating the sealing compound. As an alternative, it is conceivable to implement the curing by spraying with a curing agent or a sprayable sealing compound with a higher proportion of filler or a catalyst. In another alternative, it is conceivable to cure the surface by irradiating with infrared light. After the sealing compound has finished flowing in the recess in which the contact pads are located, a concluding curing step can be carried out so that the entire sealing compound is hardened.

In accordance with a concomitant feature of the invention, the application of the sealing compound includes filling in the at least one recess in a first step and applying the sealing cap in a second step. It is advantageous if there is a short waiting time between the first and second steps. The procedure permits distance tolerances to be set between the first main side of the semiconductor chip and the height of the sealing cap. In addition, the risk of the formation of bubbles in the recess is reduced.

Other features that are considered as characteristic for the invention are set forth in the appended claims.

Although the invention is illustrated and described herein as embodied in a semiconductor component and method for manufacturing it, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 1 is a fragmentary, cross-sectional view of a BOC semiconductor component in which the recesses have not yet been covered with a sealing compound;

FIG. 2 is a fragmentary, cross-sectional view of a semiconductor component according to the invention in which the sealing compound has been manufactured in two steps; and FIG. 3 is a fragmentary, cross-sectional view of a further exemplary embodiment of a semiconductor component according to the invention that is fabricated in accordance with the manufacturing method according to the invention.

DESCRIPTION OF THE PREFERRED EMBODIMENTS

In all the figures of the drawing, sub-features and integral parts that correspond to one another bear the same reference symbol in each case.

Referring now to the figures of the drawings in detail and first, particularly to FIG. 1 thereof, there is shown a cross-sectional detail of a BOC semiconductor component. A semiconductor chip 1 has contact pads 2 on a first main side 11. In FIG. 1, only one contact pad 2 is illustrated, but, of course, the semiconductor chip 1 can have a multiplicity of contact pads on its first main side 11. A wiring foil 3 is applied to the first main side 11. The wiring foil 3 is made of a substrate 5 on which conductor tracks 6 are applied. A solder stop mask 7, 7' is placed on the conductor tracks 6. The wiring foil 3 is applied to the first main side 11 of the semiconductor chip 1 with an adhesive layer 4. The wiring foil 3 has at least one recess 9 at the locations of the contact pads 2. If the contact pads 2 are disposed in a row, they can all be positioned in one and the same recess. However, a separate recess may be provided for each of the contact pads 2 or for some of them. The solder stop mask 7, 7' is embodied such that it does not cover the conductor tracks 6 adjacent to the recess 9 and makes conductor track ends 12, 12' accessible. In addition, the solder stop mask 7 has further recesses 10 into which a soldered contact can be introduced. Typically, a conductor track 6 will end at the locations of a recess 10. However, a plurality of soldered contacts can, of course, also be electrically connected to one and the same conductor track. The conductor track end 12 is connected through a wire connection 8, in the exemplary embodiment as a bonding wire, to the contact pad 2 of the semiconductor chip. The conductor track end 12' is provided in a recess in the solder stop mask 7' merely for reasons of symmetry. It is theoretically also conceivable to make the solder stop mask 7' continue as far as the edge of the recess 9.

To ensure moisture protection and mechanical protection of the wire connection 8, the recess 9, and the conductor track ends 12, 12' are surrounded by a sealing compound. To prevent the occlusion of air, the sealing compound generally has a very low viscosity when it is applied. As a result, some of the sealing compound can get onto the surface of the solder stop mask 7, 7' and run in the direction of the recesses 10. If the sealing compound comes into contact with the conductor track end 13, it is not possible to make a reliable electrical connection between the conductor track end 13 and a soldered contact.

The invention solves such a problem in that, according to a first variant, the sealing compound is applied in two steps. A first layer 15 merely fills in the recess 9. The first layer 15 may extend at maximum up to the upper edge of the solder stop mask here, with the result that the sealing compound is prevented from running on the surface of the solder stop mask. The material of the first layer has a low viscosity so that possible air occlusions in the recess 9 are avoided. Subsequently, a second layer 16 is applied that forms a type of "sealing cap". The second layer 16 is made of a material having a higher viscosity than the first layer.

The quantity of the first layer 15 is ideally dimensioned such that it does not rise over the edges of the solder stop mask 7, 7'. However, if the rise nevertheless occurs, the sealing compound spreads out relatively slowly on the surface of the solder stop mask 7, 7' due to the high viscosity. Thus, there is sufficient time for the sealing compound to cure. Subsequently, soldered contacts 17 are made in the recesses 10 and are electrically connected to the conductor track end 13. The step is usually carried out as a soldering step.

In an alternative manufacturing method, the sealing compound is applied to the locations on the recess 9 and on the conductor track ends 12, 12' in a single manufacturing step. However, before the sealing compound can spread out in the direction of the recess 10, the surface 18 of the sealing compound 14 begins to harden. Note FIG. 3. As a result, the viscosity of the material is reduced to such an extent that a type of "skin" forms. Further spreading out of the sealing compound on the surface of the solder stop mask 7, 7' is therefore no longer possible. The curing can be performed by briefly heating the sealing compound, by spraying with a curing agent or a sprayable sealing compound with a higher proportion of filler or catalyst, or irradiation with an infrared lamp. It is, in principle, conceivable to use any sprayable material that results in rapid curing of the surface of the sealing compound.

Of course, it is also conceivable, when applying the sealing compound in two steps, to cure the surface of the second layer 16 (as shown in FIG. 2). When the sealing compound is applied in two steps, it is also conceivable to cure the first layer before the second layer is applied. It is also conceivable to apply the second layer while the first layer is still in liquid form to achieve a good connection between the first and second layers. Two chemically different materials for the first and second layers may be used. All that needs to be considered are the requirements in terms of the desired viscosity, thixotropy, and the creepage properties. The adjustment of the viscosity of the first and second layers can be achieved by a different proportion of filler.

We claim:

1. A semiconductor component, comprising:

a semiconductor chip having a main face;

at least one contact pad disposed on said main face;

at least one wire connection;

at least one solder contact;

a wiring foil applied to said main face;

said wiring foil having at least one recess for accommodating said at least one contact pad in said at least one recess;

said wiring foil having, on a side facing away from said main side of said semiconductor chip, at least one conductor track for connecting said at least one contact pad to said at least one solder contact, said at least one conductor track having conductor track ends;

said at least one contact pad electrically connected to at least one of said conductor track ends through said at least one wire connection; and a sealing compound surrounding said at least one wire connection, said sealing compound having a first layer and a second layer.

2. The semiconductor component according to claim 1, wherein said at least one contact pad is electrically connected to adjacent ones of said conductor track ends through said at least one wire connection.

3. The semiconductor component according to claim 1, wherein said first layer fills a maximum of said at least one recess.

4. The semiconductor component according to claim 3, wherein said second layer covers said at least one wire connection projecting out of said first layer and said at least one of said conductor track ends.

5. The semiconductor component according to claim 1, wherein said first layer has a low viscosity.

6. The semiconductor component according to claim 1, wherein said second layer has a high viscosity.

7. The semiconductor component according to claim 1, wherein:

said first layer is formed from a given material and said second layer is formed from said given material; and said first and second layers have adjustable viscosity, thixotropy, and creepage properties.

8. The semiconductor component according to claim 7, wherein said viscosity, thixotropy, and creepage properties of said first and second layers are adjustable by physical properties.

9. The semiconductor component according to claim 1, including a solder stop mask disposed on said at least one conductor track, said solder stop mask defining at least one recess for said at least one of said conductor track ends.

10. The semiconductor component according to claim 1, wherein said at least one solder contact is an array of solder balls disposed on said wiring foil.

11. A method for manufacturing a semiconductor component, which comprises:

placing at least one contact pad on a main side of a semiconductor chip;

applying a wiring foil to the main side, the wiring foil having at least one conductor track on a side facing away from the main side, the at least one conductor track having conductor track ends;

accommodating the at least one contact pad in at least one recess of the wiring foil;

producing at least one wire connection between the at least one contact pad and at least one of the conductor track ends to electrically connect the at least one contact pad to at least one conductor track end and to connect the at least one contact pad to at least one solder contact through the at least one conductor track;

applying a sealing compound to locations on the at least one recess to completely cover the at least one wire connection with the sealing compound, the sealing compound having a first layer and a second layer; and curing only the surface of the sealing compound.

\* \* \* \* \*

UNITED STATES PATENT AND TRADEMARK OFFICE
CERTIFICATE OF CORRECTION

PATENT NO.     : 6,429,537 B2
DATED          : August 6, 2002
INVENTOR(S)    : Christian Hauser et al.

It is certified that error appears in the above-identified patent and that said Letters Patent is hereby corrected as shown below:

<u>Title page,</u>
Item [54], should read as follows:

-- SEMICONDUCTOR COMPONENT AND METHOD FOR MANUFACTURING IT --

Signed and Sealed this

Fifth Day of November, 2002

*Attest:*

JAMES E. ROGAN
*Attesting Officer*      *Director of the United States Patent and Trademark Office*